United States Patent
Kyung

(10) Patent No.: US 7,045,892 B2
(45) Date of Patent: May 16, 2006

(54) STACK PACKAGE OF SEMICONDUCTOR DEVICE

(75) Inventor: Kye-hyun Kyung, Yongin-si (KR)

(73) Assignee: Samsung Electronics Co., Ltd., (KR)

( * ) Notice: Subject to any disclaimer, the term of this patent is extended or adjusted under 35 U.S.C. 154(b) by 111 days.

(21) Appl. No.: 10/884,407

(22) Filed: Jul. 2, 2004

(65) Prior Publication Data

US 2005/0001305 A1 Jan. 6, 2005

(30) Foreign Application Priority Data

Jul. 4, 2003 (KR) .................... 10-2003-0045410

(51) Int. Cl.
*H01L 29/40* (2006.01)
(52) U.S. Cl. ..................... 257/723; 257/777
(58) Field of Classification Search ............. 257/777, 257/723, 686
See application file for complete search history.

(56) References Cited

U.S. PATENT DOCUMENTS

| | | | |
|---|---|---|---|
| 5,804,874 A | 9/1998 | An et al. | 257/676 |
| 6,507,098 B1 * | 1/2003 | Lo et al. | 257/686 |
| 6,621,169 B1 | 9/2003 | Kikuma et al. | 257/780 |
| 6,836,007 B1 * | 12/2004 | Michii et al. | 257/686 |
| 2002/0027295 A1 | 3/2002 | Kikuma et al. | 257/780 |
| 2002/0050376 A1 | 5/2002 | Hogerl | 174/52.1 |

FOREIGN PATENT DOCUMENTS

| | | |
|---|---|---|
| DE | 10259221 A1 | 7/2004 |
| EP | 1156529 A2 | 11/2001 |
| JP | 2002151644 | 5/2002 |
| JP | 2002-231881 | 8/2002 |

* cited by examiner

*Primary Examiner*—Roy Potter
(74) *Attorney, Agent, or Firm*—Mills & Onello LLP

(57) ABSTRACT

Provided is a stack type semiconductor package. The semiconductor package includes a first substrate, a first semiconductor chip, a second substrate, at least one second semiconductor chip and at least one third substrate. The first substrate has external connection terminals mounted on a first surface and a plurality of lands on a second surface that is an opposite side of the first surface. The first semiconductor chip is mounted on the second surface of the first substrate. The second substrate is attached at its first surface to the first semiconductor chip and includes plural outer lands in an outer perimeter of the second surface that is the opposite side of the first surface, a window penetrating between the first and second surface, inner lands around the window of the second surface. The second semiconductor chip is mounted on the second surface of the second substrate. At least one third substrate is attached to the first surface of the second semiconductor chip and includes plural inner lands in the outer perimeter of the second surface that is the opposite side of the first surface, and the window penetrating between the first and second surface, and the inner lands around the window of the second surface. The first and second semiconductor chips have a center pad structure.

30 Claims, 7 Drawing Sheets

STACK PACKAGE OF SEMICONDUCTOR DEVICE

BACKGROUND OF THE INVENTION

This application claims the priority of Korean Patent Application No. 2003-45410, filed on Jul. 4, 2003, in the Korean Intellectual Property Office, the contents of which are incorporated herein in their entirety by reference.

1. Field of the Invention

The present invention relates to a semiconductor package, and more particularly, to a stack type semiconductor package in which multiple semiconductor chips are stacked.

2. Description of the Related Art

As the size of electronic products becomes smaller, a semiconductor device mounted on the electronic products is also becoming highly integrated and becoming smaller in size. Therefore, research on reducing size and thickness of a semiconductor package has been actively conducted in order to mount more semiconductor chips on a substrate of limited size. As a result of this active research, a chip scale package (CSP) has been developed.

The CSP reduces the area occupied by the semiconductor device by manufacturing the size of the semiconductor device almost identical with that of the semiconductor chip inside the package. In addition, the recent development of the CSP is followed by a stack type CSP reducing the occupied area of the semiconductor device by stacking plural semiconductor chips on a single substrate.

FIG. 1 is a drawing illustrating an example of a general stack type chip package.

Considering the size of the chip package, a bonding process is performed using a wire WR in a stack type chip package 100 of FIG. 1. That is, instead of stacking printed circuit boards on semiconductor chips CP1 and CP2, the respective semiconductor chips CP1 and CP2 are stacked and connected to a substrate SBT using the wire WR. An insulation or adhesion material is filled between the substrate and the semiconductor chip CP1, and between the semiconductor chips CP1 and CP2.

If the stack type package 100 of FIG. 1 has the semiconductor chips CP1 and CP2 having an edge pad structure, there is no considerable problem in manufacturing the package. However, if the stack type package 100 has the semiconductor chips CP1 and CP2 including a center pad structure, there are some difficulties in producing the package.

The reason lies in the fact that bonding is carried out in the center of the semiconductor chip in a flat type package structure which uses a single semiconductor chip for the package, whereas in the stack type package, it is performed in the outer perimeter of the semiconductor chip. Thus, in the stack type package, an extra constructing process is needed in order to execute the bonding in the outer perimeter of the semiconductor chip.

SUMMARY OF THE INVENTION

The present invention provides a stack type semiconductor package without adding an extra process resulting from usage of a center pad structured semiconductor chip having a similar size with a flat type package.

According to an aspect of the present invention, there is provided a semiconductor package including a first substrate, a first semiconductor chip, a second substrate, at least one second semiconductor chip, and at least one third substrate.

The first substrate includes a first surface, a second surface, external connection terminals formed on the first surface, and a plurality of lands formed on the second surface. The first semiconductor chip is mounted on the second surface of the first substrate.

The second substrate is attached by its first surface to the first semiconductor chip, and includes a plurality of outer lands in an outer perimeter of a second surface, a window penetrating between the first and the second surfaces, and inner lands around the window of the second surface.

The at least one second semiconductor chip is mounted on the second surface of the second substrate. The at least one third substrate is attached by its first surface to the second semiconductor chip and includes a plurality of outer lands in the outer perimeter of a second surface, a window penetrating between the first and the second surfaces, and inner lands around the window of the second surface.

The outer lands of the second substrate and the third substrate are respectively connected to the outer lands of the first substrate by an electrical connection medium. The inner lands of the second substrate are connected to pads of the first semiconductor chip via the window of the second substrate by the electrical connection medium.

The inner lands of the third substrate are connected to pads of the second semiconductor chip via the window of the third substrate by the electrical connection medium.

In one embodiment, the first and second semiconductor chips may have a center pad structure.

In one embodiment, the second and third substrates have the outer and inner lands that are connected by a circuit pattern on the concerned substrate. A size of the second and third substrate can be the same as that of the first and second semiconductor chip, respectively, and the size of the first substrate can be larger than that of the first and second semiconductor chip.

In one embodiment, the lands of the first substrate are placed in the outer perimeter of the first substrate and the external connection terminals and the corresponding lands of the first substrate are connected by the circuit pattern on the substrate.

The second and third substrates can be printed circuit boards, circuit film substrates, or circuit tape substrates. The electrical connection medium can be a conductive wire.

The windows of the second and third substrates can be placed in the center.

According to another aspect of the present invention, there is provided a semiconductor package including a first substrate, a first semiconductor chip, a second substrate, at least one second semiconductor chip, and at least one third substrate.

The first substrate includes a first surface, a second surface, external connection terminals formed on the first surface, and a plurality of lands formed on the second surface. The second substrate is attached by its first surface to the second surface of the first substrate and includes a plurality of outer lands in an outer perimeter of a second surface, a window penetrating between the first and the second surfaces, and inner lands around the window of the first surface.

The first semiconductor chip is mounted on the second surface of the second substrate. At least one third substrate is attached by its first surface to the first semiconductor chip and includes a plurality of outer lands in the outer perimeter of a second surface, a window penetrating between the first and the second surfaces, and inner lands around the window of the first surface.

The at least one second semiconductor chip is mounted on the second surface of the third substrate. The outer lands of the second substrate and the third substrate are respectively connected to the outer lands of the first substrate by an electrical connection medium. The inner lands of the second substrate are connected to pads of the first semiconductor chip via the window of the second substrate by the electrical connection medium.

The inner lands of the third substrate are connected to the pads of the second semiconductor chip via the window of the third substrate by the electrical connection medium.

A size of the second and third substrate can be smaller than that of the first substrate.

In one embodiment, each of the second and third substrates is either a flat type package substrate or a stack type package substrate.

According to still another aspect of the present invention, there is provided a semiconductor package including a first substrate, a first semiconductor chip, at least one second substrate, and at least one second semiconductor chip.

The first substrate includes a first surface, a second surface, external connection terminals formed on the first surface, a plurality of lands formed in an outer perimeter of the second surface, a window penetrating between the first and the second surfaces, and inner lands around the window of the first surface. The first semiconductor chip is mounted on the second surface of the first substrate.

The at least one second substrate is attached by its first surface to the first semiconductor chip and includes a plurality of outer lands in an outer perimeter of a second surface, a window penetrating between the first and the second surfaces, and inner lands around the window of the first surface.

The at least one second semiconductor chip is mounted on the second surface of the second substrate. The outer lands of the second substrate are connected to the outer lands of the first substrate by an electrical connection medium. The inner lands of the first substrate are connected to pads of the first semiconductor chip via the window of the first substrate by the electrical connection medium.

The inner lands of the second substrate are connected to the pads of the second semiconductor chip via the window of the second substrate by the electrical connection medium.

In one embodiment, the first substrate further includes a first circuit pattern which connects the external connection terminals and the corresponding outer lands on the first substrate, and a second circuit pattern which connects the external connection terminals and the corresponding inner lands on the first substrate. The first and second circuit patterns are not connected to each other.

In one embodiment, the second circuit pattern is made between layers of the first substrate in the case in which the first substrate is a multi-layer substrate. A size of the first substrate can be larger than that of the second substrate.

According to still another aspect of the present invention, there is provided a semiconductor package including a first substrate, a second substrate, a third substrate, a first semiconductor chip, and the second semiconductor chip.

The first substrate connects external connection terminals and a first bonding pad. The second substrate includes a first internal bonding pad connected to a second bonding pad with a wire. The third substrate includes a second internal bonding pad connected to a third bonding pad with the wire.

The first semiconductor chip has a center pad structure, and the first internal bonding pad and the center pad are connected by an electrical connection medium. The second semiconductor chip has the center pad structure, and the second internal boding pad and the center pad are connected by the electrical connection medium, The first bonding pad of the first substrate and the second bonding pad of the second substrate are connected by the electrical connection medium. The first bonding pad of the first substrate and the third bonding pad of the third substrate are connected by the electrical connection medium.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

Figure 2:
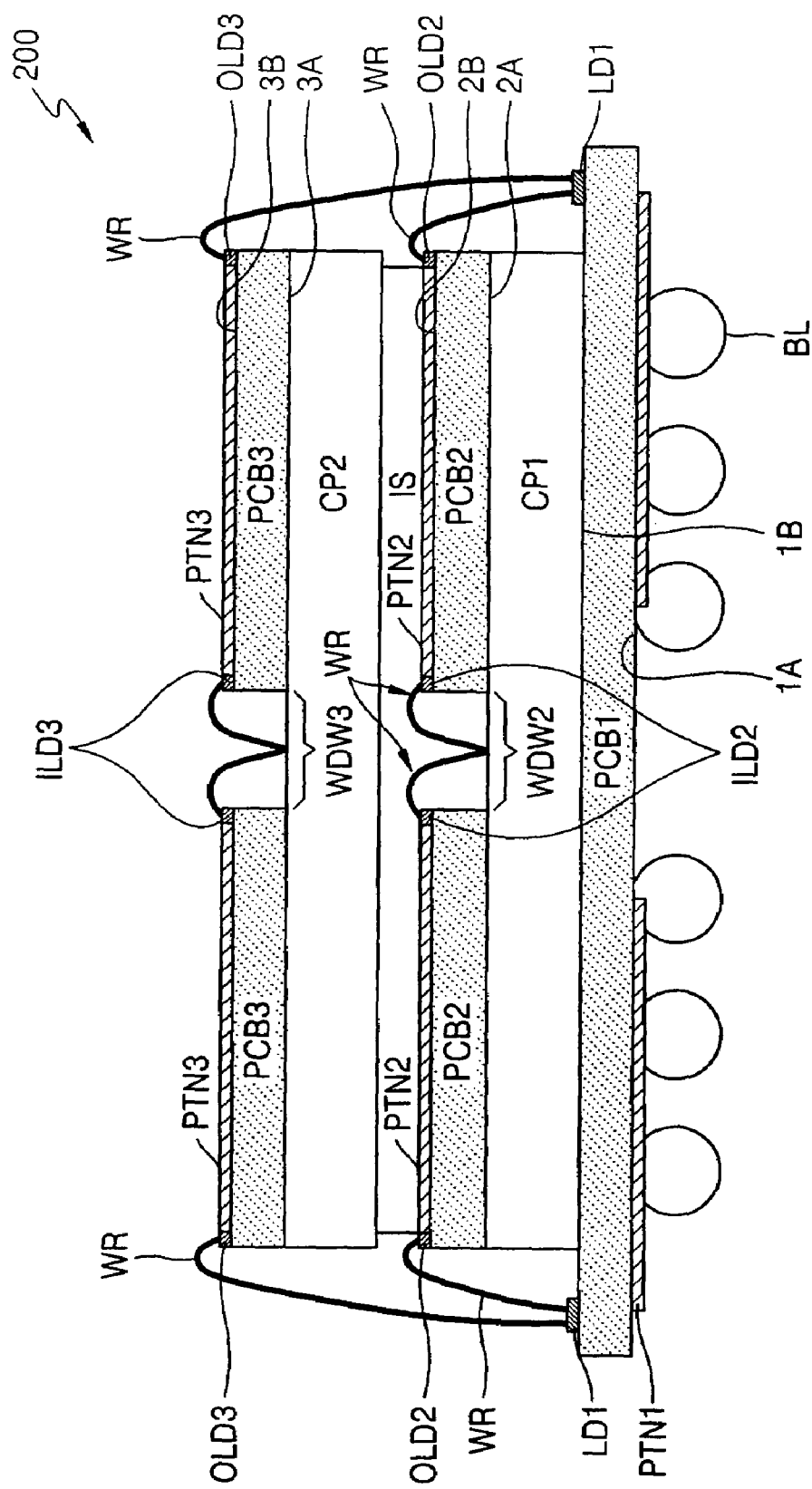
FIG. 2 is a schematic side view of a semiconductor package according to a first embodiment of the present invention.
Figure 3:
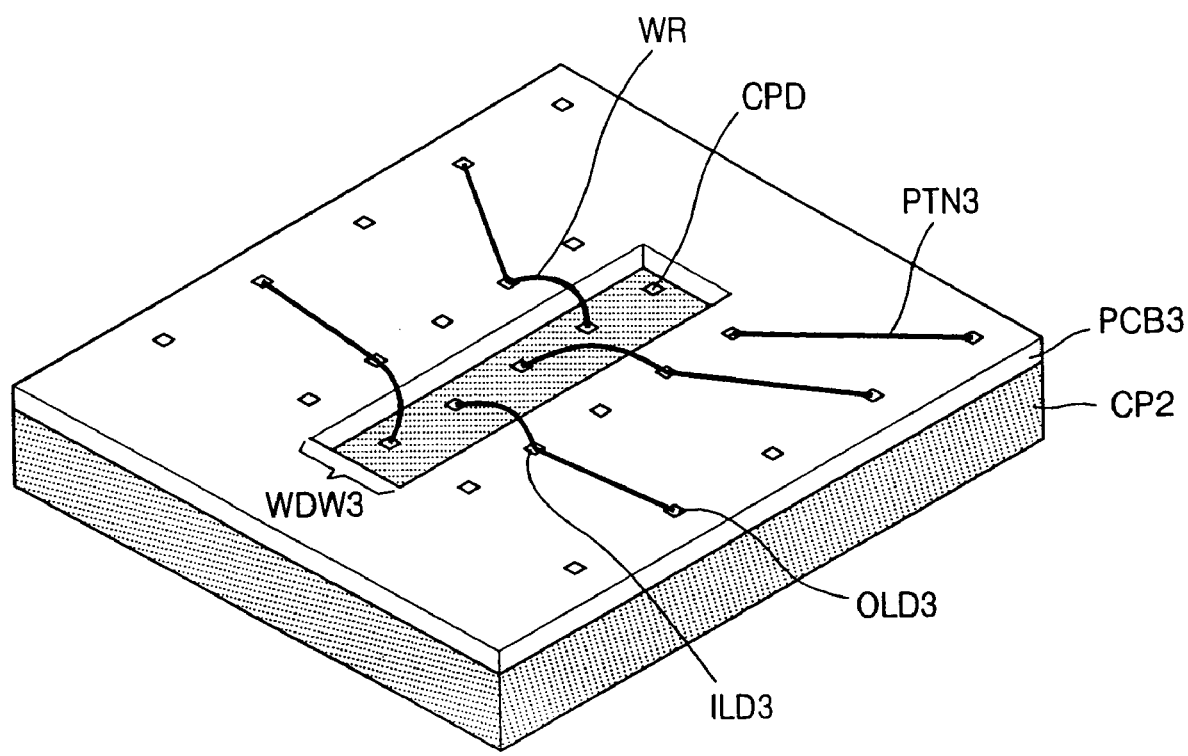
FIG. 3 is a schematic perspective view illustrating connecting relations of a third substrate of a semiconductor package and a second semiconductor chip of FIG. 2.

FIG. 2 is a schematic side view of a semiconductor package according to a first embodiment of the present invention. FIG. 3 is a schematic perspective view illustrating connecting relations of a third substrate of a semiconductor package and a second semiconductor chip of FIG. 2.

Referring to FIGS. 2 and 3, a semiconductor package 200 according to a first embodiment of the present invention includes a first substrate PCB1, a first semiconductor chip CP1, a second substrate PCB2, at least one second semiconductor chip CP2, and at least one third substrate PCB3.

The first substrate PCB1 has external connection terminals BL mounted on a first surface 1A and plural lands LD1 on a second surface 1B, which is the opposite side of the first surface 1A. The external connection terminals BL may be lead frames or balls. FIG. 2 illustrates the ball-type external connection terminals BL.

The lands LD1 of the first substrate PCB1 are placed at an outer perimeter of the first substrate PCB1. The external connection terminals BL and the corresponding lands LD1 of the first substrate PCB1 are connected by a first circuit pattern PTN1 on the first substrate PCB1. The first circuit pattern PTN1 of the first substrate PCB1 and the lands LD1 are not displayed to be connected in FIG. 2, but the lands LD1 and the circuit pattern PTN1 are electrically connected.

The first semiconductor chip CP1 mounted on the second surface 1B of the first substrate PCB1 has a center pad structure. Although the first semiconductor chip CP1 is mounted on the first substrate PCB1, the former is insulated with the latter.

A first surface 2A of the second substrate PCB2 is attached to the first semiconductor chip CP1. It includes plural outer lands OLD2 at an outer perimeter of a second surface 2B, that is an opposite side of the first surface 1A, a window WDW2 penetrating the first surface 2A and a second surface 2B, and inner lands ILD2 around the window WDW2 of the second surface 2B.

The outer lands OLD2 and the inner lands ILD2 are connected by a second circuit pattern PTN2 on the second substrate PCB2. The outer lands OLD2 of the second substrate PCB2 are connected to the lands LD1 of the first substrate PCB1 by an electrical connection medium, e.g., a wire, WR.

Also, the inner lands ILD2 of the second substrate PCB2 are connected to pads (not shown) of the first semiconductor chip CP1 via the window WDW2 of the second substrate PCB2 by the electrical connection medium WR.

Therefore, signals applied via the external connection terminals BL are applied to the outer lands OLD2 of the second substrate PCB2 via the lands LD1 of the first substrate PCB1 and the electrical connection medium WR.

The signals applied to the outer lands OLD2 of the second substrate PCB2 are applied to the inner lands ILD2 via the second circuit pattern PTN2, and then to center pads (not shown) of the first semiconductor chip CP1 by the electrical connection medium WR.

The window WDW2 of the second substrate PCB2 is a hole, which penetrates the first substrate PCB1, and, in one embodiment, is placed in the center. The inner lands ILD2 of the second substrate PCB2 and the center pads (not shown) of the first semiconductor chip CP1 are connected by the electrical connection medium WR.

Figure 1:
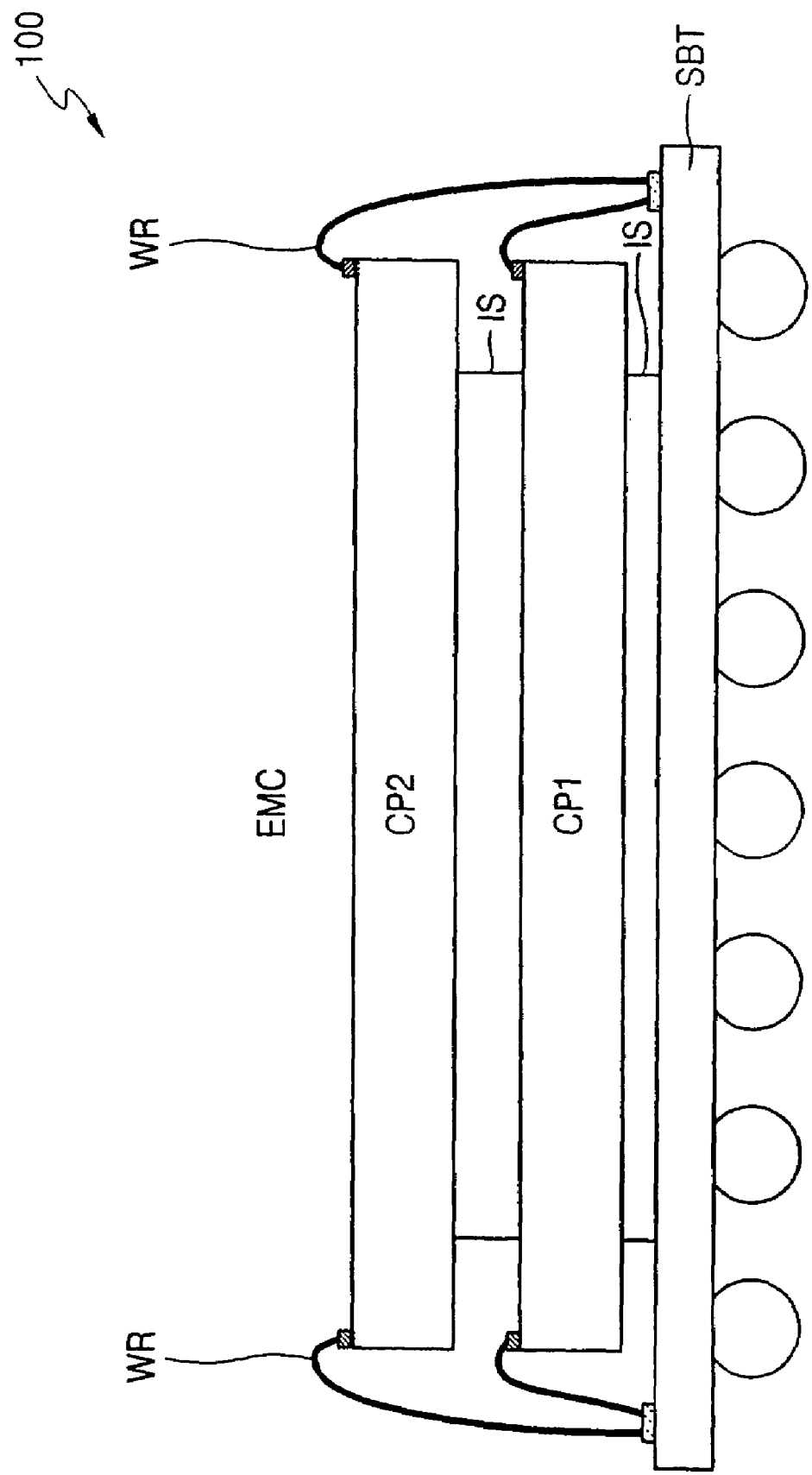
FIG. 1 is a schematic diagram illustrating a general stack type chip package.

A size of the second substrate PCB2 is almost the same as that of the first semiconductor chip CP1 and is smaller than that of the first substrate PCB1. Thus, unlike a semiconductor package 100 of the FIG. 1, the size of the stack-type package can be almost the same as that of the flat type package.

The second semiconductor chip CP2 is mounted on the second surface 2B of the second substrate PCB2. An insulation and adhesion material is filled between the second semiconductor chip CP2 and the second substrate PCB2. At least one third substrate PCB3 is attached at its first surface 3A to the second semiconductor chip CP2 and includes outer lands OLD3 at the outer perimeter of a second surface 3B, the opposite side of the first surface 3A.

In addition, the second semiconductor chip CP2 also includes a window WDW3 penetrating between the first surface 3A and the second surface 3B, and inner lands ILD3 around the window WDW3 of the second surface 3B.

The third substrate PCB3 has an identical structure with the second substrate PCB2. Connecting relations of the third substrate PCB3 and the second semiconductor chip CP2 are identical with those of the second substrate PCB2 and the first semiconductor chip CP1.

FIG. 3 is a schematic perspective view illustrating connecting relations of a third substrate PCB3 and a second semiconductor chip CP2.

A window WDW3 of the third substrate PCB3 is placed in the center of the third substrate PCB3 in order to correspond to a location of center pads CPD of the second semiconductor chip CP2. The inner lands ILD3 of the third substrate PCB3 are connected to the center pads CPD of the second semiconductor chip CP2 by the electrical connection medium WR.

The inner lands ILD3 and outer lands OLD3 are connected by a third circuit pattern PTN3. The outer lands OLD3 of the third substrate PCB3 are connected to the lands LD1 of the first substrate PCB1 by the electrical connection medium WR.

A size of the third substrate PCB3 is almost same as that of the second semiconductor chip CP2 and smaller than that of the first substrate PCB1. The second substrate PCB2 and the third substrate PCB3 may be a printed circuit board (PCB), a circuit film, or a circuit tape substrate. Moreover, the electrical connection medium WR may be a conductive wire.

In a structure like the semiconductor package 200 displayed in FIGS. 2 and 3, a whole packaging process follows a general one without requiring any extra process, and thus, there is no reliability problem.

In addition, the substrates are connected by the conductive wires and the size of the second substrate PCB2 and the third substrate PCB3 are similar to that of the semiconductor chip. Therefore, the size of the semiconductor package 200 can be formed to be almost the same as the flat type package.

Figure 4A:
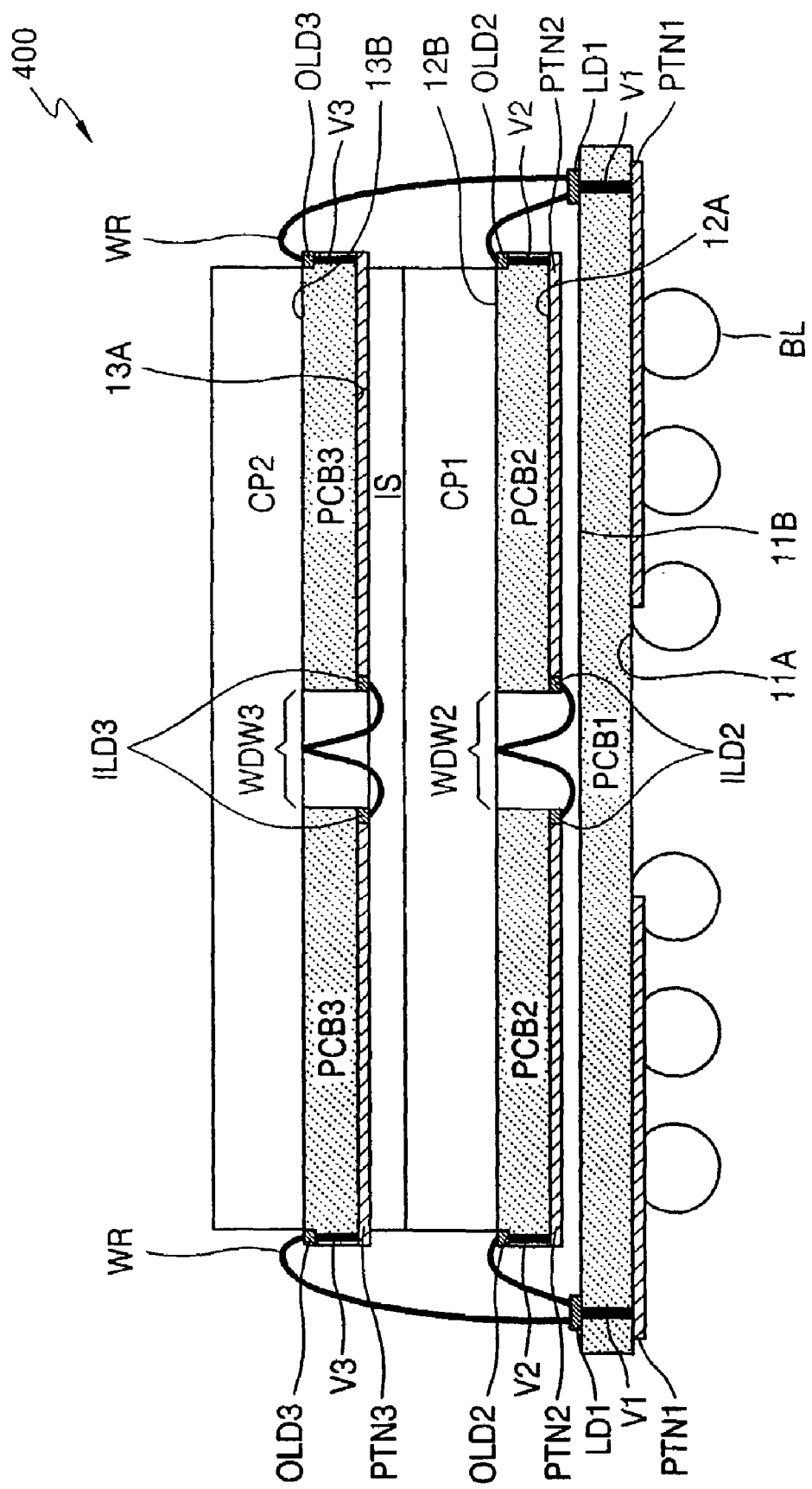
FIG. 4A is a schematic side view of a semiconductor package according to a second embodiment of the present invention.

FIG. 4A is a schematic side view of a semiconductor package according to a second embodiment of the present invention.

Referring to FIG. 4A, directions of the second substrate PCB2 and the first semiconductor chip CP1 are opposite to that of the semiconductor package 200 in FIG. 2. Likewise, directions of the third substrate PCB3 and the second semiconductor chip CP2 are opposite to that of the semiconductor package of 200 in FIG. 2.

A first substrate PCB1 of a semiconductor package 400 according to the second embodiment of the present invention has an identical structure with the first substrate PCB1 of the semiconductor package 200 in FIG. 2 according to the first embodiment of the present invention. Thus, detailed explanation thereof will not be repeated. Unlike FIG. 2, FIG. 4A shows a via V1 through which the lands LD1 are connected to the circuit pattern PTN1 on the first substrate PCB1.

A first surface 12A of a second substrate PCB2 is attached to a second surface 11B of the first surface PCB1 and includes the outer lands OLD2 in an outer perimeter of the second surface 12B that is an opposite side of the first surface 12A.

The second substrate PCB2 includes a window WDW2 penetrating the first surface 12A and the second surface 12B and the inner lands ILD2 around the window WDW2 of the first surface 12A. The second substrate PCB2 includes a via V2 through which the outer lands OLD2 are connected to the circuit pattern PTN2.

The outer lands OLD2 of the second substrate PCB2 are connected to lands LD1 of the first substrate PCB1 by the electrical connection medium WR and the inner lands ILD2 of the second substrate PCB2 are connected to pads (not shown) of the first semiconductor chip CP1 via the window WDW2 of the second substrate PCB2 by the electrical connection medium WR.

The first semiconductor chip CP1 mounted on the second surface 12B of the second substrate PCB2 has the center pad structure.

The connecting structure of the third substrate PCB3 and the second semiconductor chip CP2 is identical with that of the second substrate PCB2 and the first semiconductor chip CP1. Outer lands QLD3 of the third substrate PCB3 are connected to the lands LD1 of the first substrate PCB1 by the electrical connection medium WR. The third substrate PCB3 includes a via V3 through which the outer lands OLD3 are connected to the circuit pattern PTN3.

The inner lands ILD3 of the third substrate PCB3 are connected to pads (not shown) of the second semiconductor chip CP2 via a window WDW3 of the third substrate PCB3 by the electrical connection medium WR. The size of the second substrate PCB2 and the third substrate PCB3 are smaller than that of the first substrate PCB1.

In a semiconductor package 400 according to the second embodiment of the present invention, directions of the second substrate PCB2 and the first semiconductor chip CP1 are opposite to that of the semiconductor package 300 in FIG. 3, and directions of the third substrate PCB3 and the second semiconductor chip CP2 are opposite to that of the semiconductor package 300 in FIG. 3. This structure is similar to the flat type package only with a single semiconductor chip.

Therefore, a flat type package substrate may be used as the second substrate PCB2 and the third substrate PCB3. If that is the case, the parts of the structure are simplified, resulting in cost savings.

Figure 4B:
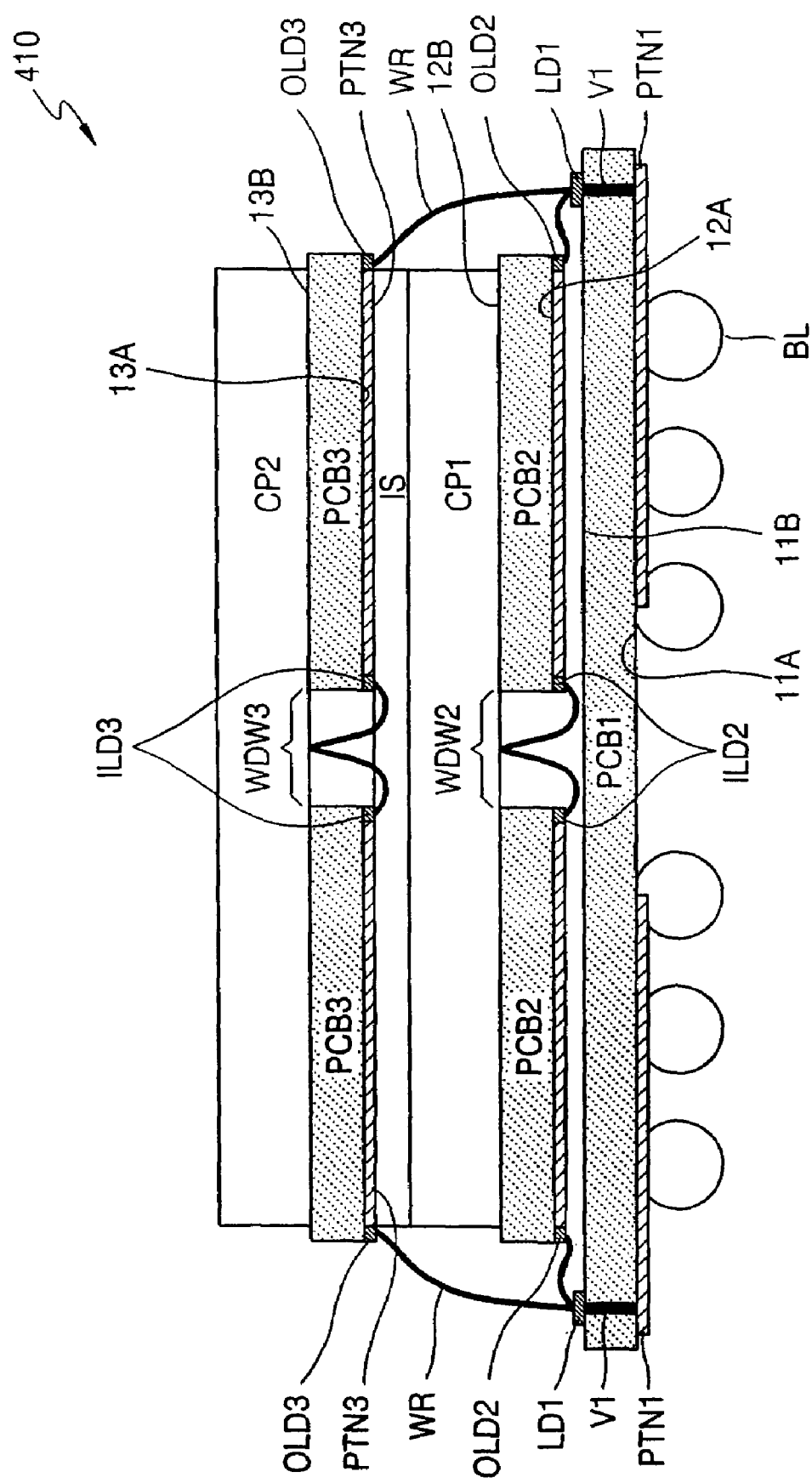
FIG. 4B is a schematic side view of a modified structure of the semiconductor package shown in FIG. 4A.

FIG. 4B is a schematic side view of a modified structure of the semiconductor package shown in FIG. 4A. A semiconductor package 410 shown in FIG. 4B does not include a via in the second and third substrates PCB2 and PCB3.

Unlike the second and third substrates PCB2 and PCB3 of the semiconductor package 400 shown in FIG. 4A, the second and third substrates PCB2 and PCB3 of the semiconductor package 410 shown in FIG. 4B have the outer lands OLD2 and OLD3 on the first surfaces 12A and 13A, respectively, so that the outer lands OLD2 and OLD3 are directly connected to the circuit patterns PTN2 and PTN3, respectively.

The structure of the semiconductor package 410 shown in FIG. 4B is the same as that of the semiconductor package 400 shown in FIG. 4A, with the exception of the above-described difference, and thus a detailed description thereof will not be repeated.

Figure 5A:
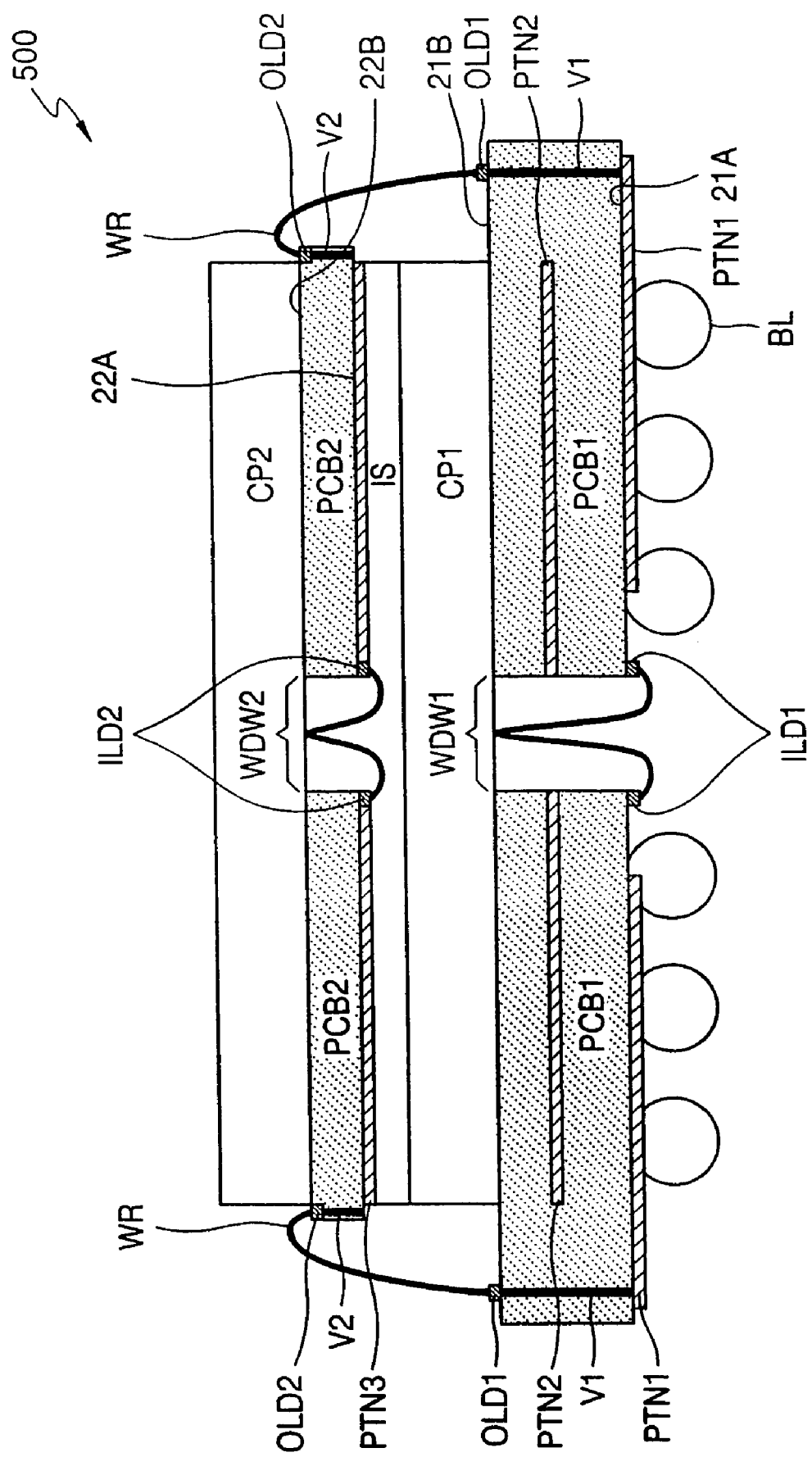
FIG. 5A is a schematic side view of a semiconductor package according to a third embodiment of the present invention.

FIG. 5A is a schematic side view of a semiconductor package according to a third embodiment of the present invention.

A semiconductor package 500 according to the third embodiment of the present invention includes a first substrate PCB1, a first semiconductor chip CP1, at least one second substrate PCB2, and at least one second semiconductor chip CP2.

The first substrate PCB1 has outer connection terminals BL mounted on a first surface 21A and the outer lands OLD1 at an outer perimeter of a second surface 21B, that is an opposite side of the first surface 21A.

Moreover, the first substrate PCB1 has a window WDW1 penetrating between the first surface 21A and the second surface 21B and inner lands ILD1 around the window WDW1 of the first surface 21A. The first semiconductor chip CP1 is mounted on the second surface 21B of the first substrate PCB1.

The first substrate PCB1 according to the third embodiment of the present invention, unlike the first substrate in FIGS. 2 and 4, includes the window WDW1 in the center. And, the inner lands ILD1 placed around the window WDW1 and the center pads (not shown) of the first semiconductor chip CP1 are connected by the electrical connection medium WR.

In the first substrate PCB1, the outer lands OLD1 and the first circuit pattern PTN1 are connected to each other through the via V1.

The semiconductor package 500 according to the third embodiment may have one less substrate than the semiconductor packages 200 and 400 according to the first and second embodiments of the present invention. Thus, the semiconductor package 500 can minimize its thickness.

In the first substrate PCB1, the outer connection terminals BL and corresponding outer lands OLD1 of the first substrate PCB1 are connected by the first circuit pattern PTN1 on the first substrate PCB1. In addition, the outer connection terminals BL and the corresponding inner lands ILD1 of the first substrate PCB1 are connected by the second circuit pattern PTN2 on the first substrate PCB1. The first circuit pattern PTN1 and the second circuit pattern PTN2 are not connected to each other.

Outer signals applied to the outer connection terminals BL are transferred to the outer lands OLD1 of the first substrate PCB1 through the first circuit pattern PTN1. The transferred signals are retransferred to the outer lands OLD2 of the second substrate PCB2 by the electrical connection medium WR connected to the outer lands OLD1.

Furthermore, outer signals applied to the outer connection terminals BL are transferred to the inner lands ILD1 of the first substrate PCB1 through the second circuit pattern PTN2. The transferred signals are retransferred to the center pads (not shown) of the first semiconductor chip CP1 by the electrical connection medium WR connected to the inner lands ILD1.

The first circuit pattern PTN1 and the second circuit pattern PTN2 should not be electrically connected since the first circuit pattern PTN1 transfers the outer signals to the second substrate PCB2 and the second circuit pattern PTN2 transfers the outer signals to the first semiconductor chip CP1.

If the first substrate PCB1 is a multi-layer one, the second circuit pattern PTN2 can be formed between layers of the first substrate PCB1. The multi-layered first substrate PCB1 is illustrated in FIG. 5A. The second circuit pattern PTN2 is wired between the layers of the first substrate PCB1.

Although it looks like that the outer connection terminals BL are not connected to the second circuit pattern PTN2 in FIG. 5A, the outer connection terminals BL are actually connected to the second circuit pattern PTN2 through a "via" (not shown) of the first substrate PCB1.

A first surface 22A of the second substrate PCB2 is attached to the first semiconductor chip CP1 and includes the outer lands OLD2 in an outer perimeter of a second surface 22B that is an opposite side of the first surface 22A.

Moreover, the second substrate PCB2 includes a window WDW2 penetrating the first surface 22A and the second surface 22B and the inner lands ILD2 around the window WDW2 of the first surface 22A. The second substrate PCB2 includes the via V2 through which the circuit pattern PTN3 is connected to the outer lands OLD2.

The second semiconductor chip CP2 is mounted on the second surface 22B of the second substrate PCB2. The outer lands OLD2 of the second substrate PCB2 are connected to the outer lands OLD1 of the first substrate PCB1 by the electrical connection medium WR.

Outer signals transferred to the outer lands OLD2 of the second substrate PCB2 through the outer connection terminals BL and the first circuit pattern PTN1 are retransferred to the inner lands ILD2 of the second substrate PCB2 by the third circuit pattern PTN3 connected to the outer lands OLD2.

The inner lands ILD2 of the second substrate PCB2 are connected to pads (not shown) of the second semiconductor chip CP2 via the window WDW2 of the second substrate PCB2 by the electrical connection medium WR. A thickness of the semiconductor package can be reduced in the semiconductor package 500 having the above structure according to the third embodiment of the present invention.

Figure 5B:
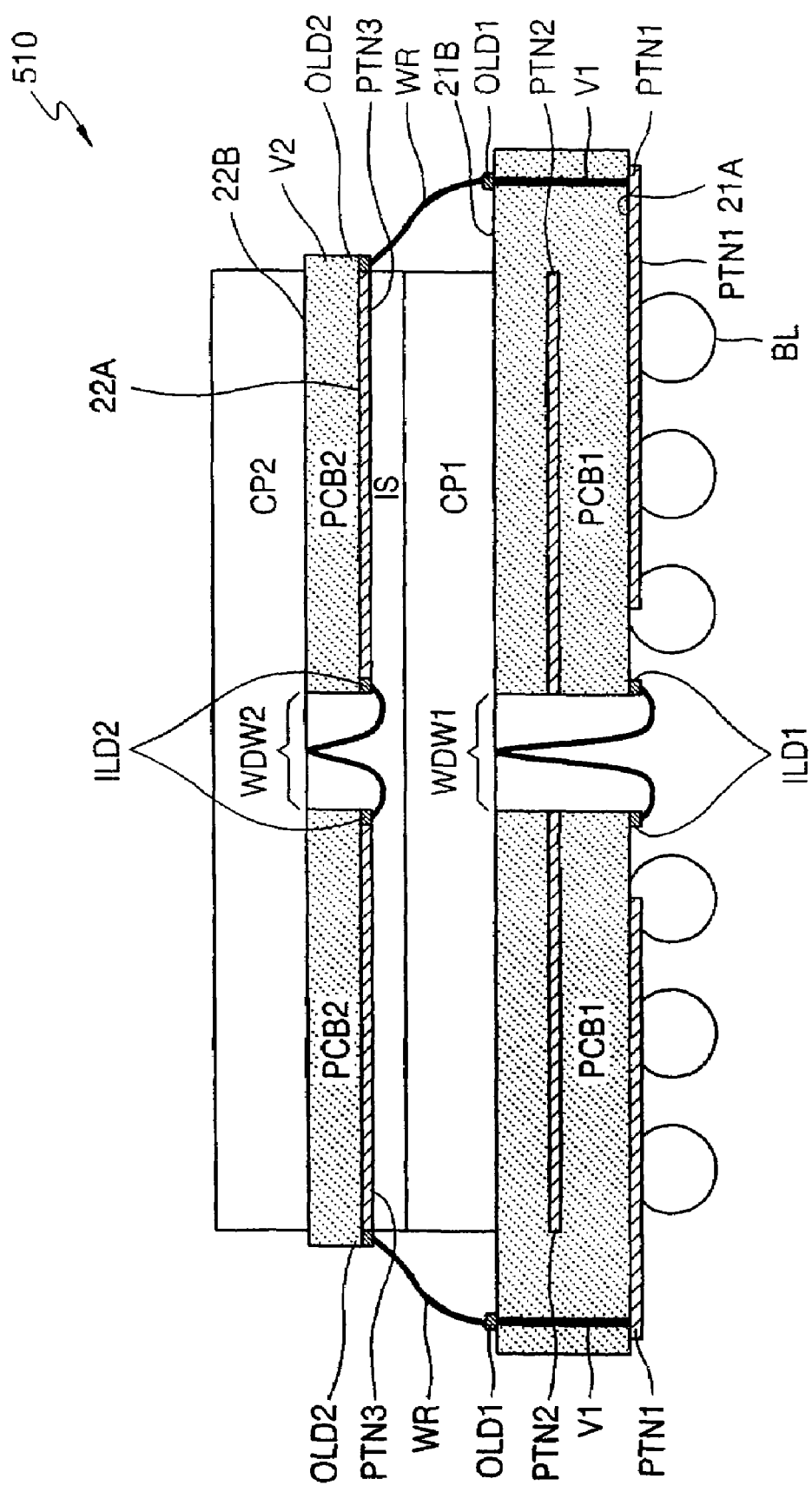
FIG. 5B is a side view of a modified structure of the semiconductor package shown in FIG. 5A.

FIG. 5B is a schematic side view of a modified structure of the semiconductor package shown in FIG. 5A. A semiconductor package 510 shown in FIG. 5B does not include a via in the second substrate PCB2.

Unlike the second substrate PCB2 of the semiconductor package 500 shown in FIG. 5A, the second substrate PCB2 of the semiconductor package 510 shown in FIG. 5B has the outer lands OLD2 on the first surface 22A so that the outer lands OLD2 are directly connected to a circuit pattern PTN3.

The structure of the semiconductor package 510 shown in FIG. 5B is the same as that of the semiconductor package 500 shown in FIG. 5A, with the exception of the above-described difference, and thus a detailed description thereof will not be repeated.

As described above, the semiconductor package according to the present invention has an advantage of reducing an occurrence of a defective semiconductor package since the general packaging process is used without extra processes. In addition, the size of the semiconductor package is almost the same as the flat type package since the substrates are connected via conductive wires and the size of the second and third substrate are almost the same as the semiconductor chip.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
a first substrate having a first surface, a second surface, external connection terminals formed on the first surface, and a plurality of lands formed on the second surface;
a first semiconductor chip mounted on the second surface of the first substrate;
a second substrate attached by its first surface to the first semiconductor chip and including a plurality of outer lands in an outer perimeter of a second surface, a window penetrating between the first and the second surfaces, and inner lands around the window of the second surface;
at least one second semiconductor chip mounted on the second surface of the second substrate; and
at least one third substrate attached by its first surface to the second semiconductor chip and including a plurality of outer lands in the outer perimeter of a second surface, a window penetrating between the first and the second surfaces, and inner lands around the window of the second surface,
wherein the outer lands of the second substrate and the third substrate are respectively connected to the outer lands of the first substrate by an electrical connection medium;
wherein the inner lands of the second substrate are connected to pads of the first semiconductor chip via the window of the second substrate by the electrical connection medium; and
wherein the inner lands of the third substrate are connected to pads of the second semiconductor chip via the window of the third substrate by the electrical connection medium.

2. The semiconductor package of claim 1, wherein the first and second semiconductor chip have a center pad structure.

3. The semiconductor package of claim 1, wherein the second and third substrate have the outer and inner lands that are connected by a circuit pattern on the concerned substrate.

4. The semiconductor package of claim 1, wherein a size of the second and third substrate are the same as that of the first and second semiconductor chip, respectively and the size of the first substrate is larger than that of the first and second semiconductor chip.

5. The semiconductor package of claim 1, wherein the lands of the first substrate are placed in the outer perimeter of the first substrate and the external connection terminals and the corresponding lands of the first substrate are connected by the circuit pattern on the substrate.

6. The semiconductor package of claim 1, wherein the second and third substrate are printed circuit boards, circuit film substrates or circuit tape substrates.

7. The semiconductor package of claim 1, wherein the electrical connection medium is a conductive wire.

8. The semiconductor package of claim 1, wherein the windows of the second and third substrate are placed in the center.

9. A semiconductor package comprising:
a first substrate having a first surface, a second surface, external connection terminals formed on the first surface, and a plurality of lands formed on the second surface;
a second substrate attached by its first surface to the second surface of the first substrate and including a plurality of outer lands in an outer perimeter of a second surface, a window penetrating between the first and the second surfaces, and inner lands around the window of the first surface;
a first semiconductor chip mounted on the second surface of the second substrate;
at least one third substrate attached by its first surface to the first semiconductor chip and including a plurality of outer lands in the outer perimeter of a second surface, a window penetrating between the first and the second surfaces, and inner lands around the window of the first surface; and
at least one second semiconductor chip mounted on the second surface of the third substrate,
wherein the outer lands of the second substrate and the third substrate are respectively connected to the outer lands of the first substrate by an electrical connection medium;
wherein the inner lands of the second substrate are connected to pads of the first semiconductor chip via the window of the second substrate by the electrical connection medium; and
wherein the inner lands of the third substrate are connected to the pads of the second semiconductor chip via the window of the third substrate by the electrical connection medium.

10. The semiconductor package of claim 9, wherein the first and second semiconductor chips have a center pad structure.

11. The semiconductor package of claim 9, wherein the second and third substrates have the outer and inner lands connected by a circuit pattern on the concerned substrate.

12. The semiconductor package of claim 9, wherein a size of the second and third substrate is smaller than that of the first substrate.

13. The semiconductor package of claim 9, wherein the lands of the first substrate are placed in the outer perimeter of the first substrate and the external connection terminals and corresponding lands of the first substrate are connected by the circuit pattern on the substrate.

14. The semiconductor package of claim 9, wherein the second and third substrate are printed circuit boards, circuit film substrates, or circuit tape substrates.

15. The semiconductor package of claim 9, wherein the electrical connection medium is a conductive wire.

16. The semiconductor package of claim 9, wherein the window of the second and third substrate is placed in the center.

17. The semiconductor package of claim 9, wherein each of the second and third substrates is either a flat type package substrate or a stack type package substrate.

18. A semiconductor package comprising:
a first substrate having a first surface, a second surface, external connection terminals formed on the first surface, a plurality of lands formed in an outer perimeter of the second surface, a window penetrating between the first and the second surfaces, and inner lands around the window of the first surface;
a first semiconductor chip mounted on the second surface of the first substrate;
at least one second substrate attached by its first surface to the first semiconductor chip and including a plurality of outer lands in an outer perimeter of a second surface, a window penetrating between the first and the second surfaces, and inner lands around the window of the first surface; and
at least one second semiconductor chip mounted on the second surface of the second substrate,
wherein the outer lands of the second substrate are connected to the outer lands of the first substrate by an electrical connection medium;
wherein the inner lands of the first substrate are connected to pads of the first semiconductor chip via the window of the first substrate by the electrical connection medium; and
wherein the inner lands of the second substrate are connected to the pads of the second semiconductor chip via the window of the second substrate by the electrical connection medium.

19. The semiconductor package of claim 18, wherein the first and second semiconductor chip have a center pad structure.

20. The semiconductor package of claim 18, wherein the first substrate further comprises:
a first circuit pattern which connects the external connection terminals and the corresponding outer lands on the first substrate; and
a second circuit pattern which connects the external connection terminals and the corresponding inner lands on the first substrate, and the first and second circuit patterns are not connected to each other.

21. The semiconductor package of claim 20, wherein the second circuit pattern is made between layers of the first substrate in the case in which the first substrate is a multi-layer substrate.

22. The semiconductor package of claim 18, wherein the second substrate further comprises a circuit pattern which connects the outer and inner lands thereon.

23. The semiconductor package of claim 18, wherein a size of the first substrate is larger than that of the second substrate.

24. The semiconductor package of claim 18, wherein the first and second substrate are printed circuit boards, circuit film substrates, or circuit tape substrates.

25. The semiconductor package of claim 18, wherein the electrical connection medium is a conductive wire.

26. The semiconductor package of claim 18, wherein the window of the first and second substrate is placed in the center.

27. The semiconductor package of claim 18, wherein the second substrate is either a flat type package substrate or a stack type package substrate.

28. A semiconductor package comprising:
a first substrate connecting external connection terminals and a first bonding pad;
a second substrate having a first internal bonding pad connected to a second bonding pad with a wire;
a third substrate having a second internal bonding pad connected to a third bonding pad with the wire;
a first semiconductor chip having a center pad structure, the first internal bonding pad and the center pad being connected by an electrical connection medium; and
a second semiconductor chip having the center pad structure, the second internal boding pad and the center pad of the second semiconductor chip being connected by the electrical connection medium,
wherein the first bonding pad of the first substrate and the second bonding pad of the second substrate are connected by the electrical connection medium; and
wherein the first bonding pad of the first substrate and the third bonding pad of the third substrate are connected by the electrical connection medium.

29. The semiconductor package of claim 28, wherein the second and third substrate are printed circuit boards, circuit film substrates, or circuit tape substrates.

30. The semiconductor package of claim 28, the electrical connection medium is a conductive wire.

* * * * *